United States Patent
Usui et al.

(10) Patent No.: US 7,259,866 B2
(45) Date of Patent: *Aug. 21, 2007

(54) SEMICONDUCTOR FABRICATING APPARATUS WITH FUNCTION OF DETERMINING ETCHING PROCESSING STATE

(75) Inventors: Tatehito Usui, Chiyoda (JP); Motohiko Yoshigai, Hikari (JP); Kazuhiro Jyouo, Kudamatsu (JP); Tetsuo Ono, Iruma (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/289,394

(22) Filed: Nov. 30, 2005

(65) Prior Publication Data

US 2006/0077397 A1    Apr. 13, 2006

Related U.S. Application Data (63) Continuation of application No. 10/377,823, filed on Mar. 4, 2003, now Pat. No. 6,972,848.

(51) Int. Cl.
   *G01B 9/02* (2006.01)
(52) U.S. Cl. .................................... 356/503
(58) Field of Classification Search ............... 356/451, 356/503, 504, 519; 536/19
   See application file for complete search history.

(56) References Cited

U.S. PATENT DOCUMENTS

| | | |
|---|---|---|
| 4,767,495 A | 8/1988 | Nishioka |
| 5,552,016 A | 9/1996 | Ghanayem |
| 5,648,849 A | 7/1997 | Canteloup |
| 5,658,418 A | 8/1997 | Coronel |
| 5,835,226 A | 11/1998 | Berman |
| 5,928,532 A | 7/1999 | Koshimizu |
| 6,081,334 A | 6/2000 | Grimbergen |

(Continued)

FOREIGN PATENT DOCUMENTS

EP    0412728    2/1991

(Continued)

OTHER PUBLICATIONS

Lide et al, CRC Handbook of Chemistry and Physics, CRC Press.
RWB Pearse and AG Gaydon, "The Identification of Molecular Spectra", John Wiley & Sons, 1976.

(Continued)

*Primary Examiner*—HWA (Andrew) Lee
(74) *Attorney, Agent, or Firm*—Antonelli, Terry, Stout & Kraus, LLP.

(57) ABSTRACT

A semiconductor fabricating apparatus for etching a semiconductor wafer, which is placed in a chamber and which has a multiple-layer film composed of a first film formed on a surface thereof and a second film formed on the first film, using plasma generated in the chamber. The semiconductor fabricating apparatus includes a light detector that detects a change in an amount of light with a plurality of wavelengths obtained from the surface of the wafer for a predetermined time during which the second film is etched, and a detection unit that detects a thickness of the first film based on a specific waveform obtained from an output of the detector.

4 Claims, 9 Drawing Sheets

U.S. PATENT DOCUMENTS

| | | |
|---|---|---|
| 6,207,008 B1 | 3/2001 | Kijima |
| 6,261,470 B1 | 7/2001 | Smith, Jr. |
| 6,297,064 B1 | 10/2001 | Koshimizu |
| 6,306,669 B1 | 10/2001 | Yano |
| 6,383,402 B1 | 5/2002 | Smith, Jr. |
| 6,414,499 B2 | 7/2002 | Yano |
| 6,510,706 B2 | 1/2003 | Schertler |
| 6,815,228 B2 | 11/2004 | Usui |
| 6,888,639 B2 | 5/2005 | Goebel |
| 6,903,826 B2 | 6/2005 | Usui |
| 6,961,131 B2 * | 11/2005 | Usui et al. ............... 356/503 |
| 6,972,848 B2 | 12/2005 | Usui et al. |
| 2001/0016053 A1 | 8/2001 | Dickson |
| 2003/0085198 A1 | 5/2003 | Yi et al. |
| 2004/0040658 A1 | 3/2004 | Usui |
| 2004/0174530 A1 | 9/2004 | Usui et al. |
| 2005/0018207 A1 | 1/2005 | Usui |

FOREIGN PATENT DOCUMENTS

| | | |
|---|---|---|
| EP | 1 089 146 | 4/2001 |
| JP | 61-53728 | 3/1986 |
| JP | 63-200533 | 8/1988 |
| JP | 64-68932 | 3/1989 |
| JP | 5-179467 | 7/1993 |
| JP | 6-84849 | 3/1994 |
| JP | 2000-97648 | 4/2000 |
| JP | 2000-106356 | 4/2000 |
| JP | 2000-228397 | 8/2000 |
| JP | 2000-324297 | 11/2000 |

OTHER PUBLICATIONS

Sasaki et al, "Estimation Of Component Spectal Curves From Unknown Mixture Spectra", App. Opt. vol. 23, pp. 1955-1959 (1984).

* cited by examiner

SEMICONDUCTOR FABRICATING APPARATUS WITH FUNCTION OF DETERMINING ETCHING PROCESSING STATE

CROSS-REFERENCE TO RELATED APPLICATION

This application is a continuation application of U.S. Ser. No. 10/377,823, filed Mar. 4, 2003 now U.S. Pat. No. 6,972,848, the subject matter of which is incorporated herein by reference.

The present invention is related to U.S. patent application Ser. No. 09/946504 filed on Sep. 6, 2001 and U.S. patent application Ser. No. 10/230309 filed on Aug. 29, 2002.

BACKGROUND OF THE INVENTION

The present invention relates to an apparatus that fabricates semiconductor devices through etching processing and more particularly to a semiconductor fabricating apparatus that has a function of determining the etching processing state such as an etched depth.

Dry-etching has been widely used in the semiconductor device formation process to remove layers of various materials, such as dielectric materials and insulating materials, formed on the surface of a semi-conductor wafer or to form patterns on those layers. In the dry-etching process, it is important to adjust etching during the processing of the layers so that an etched depth desired for a layer may be obtained or so that a thin film desired for a layer may be obtained. Therefore, it is required to accurately detect the end points of etching process and the film thickness.

When dry-etching a semiconductor wafer using plasma, it is known that the light emission intensity of a specific-wavelength light included in a plasma light changes with the progress of the etching process of a specific layer. One of known technologies for checking the etching states, such as the end point of etching process and the film thickness on a semiconductor wafer, takes advantage of this characteristics to detect a change in the light emission intensity of a specific-wavelength light included in the plasma light during the dry-etching process and, based on this checking result, detects the end point of etching process on a specific layer and the film thickness of the layer. To increase detection precision, a misdetection caused by a fluctuation in the detected waveform generated by noises should be reduced.

Recently, as the wiring pitch of a semiconductor becomes finer and its density becomes higher, the open area ratio (non-etched area on a semiconductor wafer) becomes lower. This decreases the light emission intensity of a specific-wavelength light sent from the light sensor to the light detector. As a result, the level of the sampling signal from the light detector becomes lower, making it difficult for the end point determination unit to correctly detect the end point of etching process based on the sampling signal from the light detector.

When stopping processing upon detection of the end point of etching process, it is important that the thickness of the remaining dielectric layer should be equal to a predetermined value. In the conventional process, the time thickness control method is used to monitor the whole process on the assumption that the etching speed of each layer is constant. An etching speed is obtained, for example, by processing a sample wafer in advance. In this method, the etching process stops at the same time the elapsed time measured by the time monitor method becomes equal to the time corresponding to a predetermined film thickness (remaining film thickness in etching process).

However, it is known that the thickness of an actual film, for example, an $SiO_2$ layer formed by the LPCVD (Low Pressure Chemical Vapor Deposition) method, varies from time to time. An allowable thickness error caused by a process fluctuation during LPCVD corresponds to about 10% of the initial thickness of the $SiO_2$ layer. This means that the actual final thickness of the remaining $SiO_2$ layer on the silicon substrate cannot be measured accurately by the time monitor method. The actual thickness of the remaining layer is measured finally by the standard emission spectroscopy. If excess etching is found, the wafer is rejected and discarded.

A technology for detecting the end point of etching process on a semiconductor wafer by measuring the surface of a wafer with the use of an interferometer is known. This technology is disclosed, for example, in JP-A-5-179467 (document 1), U.S. Pat. No. 5,658,418 (document 2), JP-A-2000-97648 (document 3), and JP-A-2000-106356 (document 4).

JP-A-5-179467 (document 1) discloses a method for detecting the end point of etching process by detecting an interference light (plasma light) using three color filters (red, green, blue). U.S. Pat. No. 5,658,418 (document 2) discloses a method for counting the extreme values (maximum and minimum of waveform: zero-pass point of differential waveform) of an interference waveform using a change in the interference waveform of two wavelengths with respect to time and its differential waveform. The etching speed is calculated by measuring the time required until the count reaches a predetermined value, the remaining etching time required until a predetermined film thickness is attained is calculated based on the calculated etching speed, and, based on the calculated time, the etching process is stopped.

JP-A-2000-97648 (document 3) discloses a method that obtains a difference waveform (that uses a wavelength as a parameter) between a light intensity pattern (that uses a wavelength as a parameter) of an interference light before processing and a light intensity pattern of the interference light after or during processing and compares the obtained waveform with the difference waveform read from the database for measuring a difference in level (film thickness). JP-A-2000-106356 (document 4), which relates to a rotary coating apparatus, discloses a method for finding the film thickness by measuring a change in the interference light of multiple wavelengths with respect to time.

When stopping processing upon detection of the end point of etching process, it is important that the thickness of the remaining film layer is close to a predetermined value as much as possible. The conventional technology monitors the film thickness by adjusting the time on the assumption that the etching speed of each layer is constant. The reference etching speed value is obtained, for example, by processing a sample wafer in advance. According to this technology, the etching process stops when the time corresponding to the predetermined film thickness elapses.

SUMMARY OF THE INVENTION

However, when semiconductor wafers with the film structure of several different types are processed in small amounts at a time for fabricating semiconductors, a database for a multiple-wavelength interference pattern of differential coefficients must be created, one for the wafer to be processed and to be fabricating into products. Therefore, when etching processing is performed on a trial basis using a wafer with the same film structure as that of an actual wafer, the test cost becomes too high for small-amount fabrication because the wafer is expensive and as many extra wafers as the number of tests are required. This results in an increased device fabrication cost.

In the prior art described above, a sample wafer is required also when the film thickness of a wafer to be used is detected for use in setting up the operating conditions of a semiconductor fabricating apparatus when the thickness detection result is used to process a wafer for fabricating a product therefrom. For example, a wafer is selected from one lot for measuring. This requires a measuring time and a wafer, decreasing the throughput of semiconductor fabrication.

It is an object of the present invention to provide a semiconductor fabricating apparatus that solves the problems with the prior art described above.

It is another object of the present invention to provide a semiconductor fabricating apparatus that increases processing throughput.

There is described a semiconductor fabricating apparatus etching a semiconductor wafer, placed in a chamber and having films thereon, using plasma generated in the chamber. The semiconductor fabricating apparatus comprises a detector that detects a change in an amount of light with at least two wavelengths obtained from a surface of the wafer for a predetermined time during the processing; and a determination function that compares an interval between a time at which an amount of light with one of the two wavelengths is maximized and a time at which an amount of light with the other wavelength is minimized with a predetermined value to determine a state of the etching.

There is described a semiconductor fabricating apparatus comprising a detector that, when a semiconductor wafer placed in a chamber is etched using plasma generated in the chamber, detects a light interference from a surface of the wafer for a predetermined time during the etching processing; and a control unit that compares an interval between a time at which an amount of light with one of at least two wavelengths output from the detector is maximized and a time at which an amount of light with the other wavelength is minimized with a predetermined value to control the etching processing.

In addition, there is described that a thickness of the film being etched is determined if the interval is determined to be smaller than the predetermined value.

In addition, there is described that the etching processing is stopped if the interval is determined to be smaller than the predetermined value.

There is described a semiconductor fabricating apparatus etching a semiconductor wafer, placed in a chamber and having a multiple-layer film composed of a first film formed a surface thereof and a second film formed on the first film, using plasma generated in the chamber. The semiconductor fabricating apparatus comprises a light detector that detects a change in an amount of light with a plurality of wavelengths obtained from a surface of the wafer for a predetermined time during which the second film is etched; and a detection function that detects a thickness of the first film based on a specific waveform obtained from an output of the detector.

There is described a semiconductor fabricating apparatus etching a semiconductor wafer, placed in a chamber and having a multiple-layer film composed of an oxide film formed a surface thereof and a film formed on the oxide film, using plasma generated in the chamber. The semiconductor fabricating apparatus comprises a light detector that detects an amount of light with a plurality of wavelengths obtained from a surface of the wafer for a predetermined time during which the film formed on the oxide film is etched; and a detection function that detects a thickness of the oxide film based on a specific waveform obtained from an output of the detector.

There is described that, when a change in an amount of interference light from the surface of the wafer with respect to time is detected for the plurality of wavelengths, a characteristic change in an output of the light detector is detected.

To detect the maximum value and the minimum value from a light from a wafer, a theoretical interference analysis is made in advance using the optical physical characteristic values of a material to be etched to obtain a change in the interference waveform for each wavelength. Then, for a predetermined film thickness, the two different wavelengths whose interference waveforms have the peak-trough correlation are selected. In addition, the interference waveforms of the two wavelengths are measured and, through differentiation, the zero-cross times of the differential values are found. If the zero-cross times are within a predetermined value, it may be determined that a desired film thickness is attained.

A differential interference pattern may be created for an interference light with multiple wavelengths that are obtained during the etching processing to attain a desired film thickness. With this multiple-wavelength differential interference pattern stored each time a wafer is etched, the data values of the interference patterns may be averaged to give more reliable multi-wavelength differential interference data. By using this data to select two interference waveforms with different wavelengths, which satisfy the peak-trough correlation for the predetermined film thickness described above, the etching condition such as the film thickness may be detected and determined more accurately.

Other objects, features and advantages of the invention will become apparent from the following description of the embodiments of the invention taken in conjunction with the accompanying drawings.

DETAILED DESCRIPTION OF THE EMBODIMENTS

Some embodiments of the present invention will be described with reference to the attached drawings.

In the description of the embodiments below, the same reference numerals as those in a first embodiment are used to denote the same components with the similar functionality, and their detailed descriptions are omitted. In the embodiments below, there is described a semiconductor fabricating apparatus according to the present invention and a method for measuring etching conditions such as the etching amount (etched depth or etched film thickness) during etching processing of a wafer that is a member to be processed. In the description below, "film thickness" refers to a remaining film thickness in the etching processing.

Figure 1:
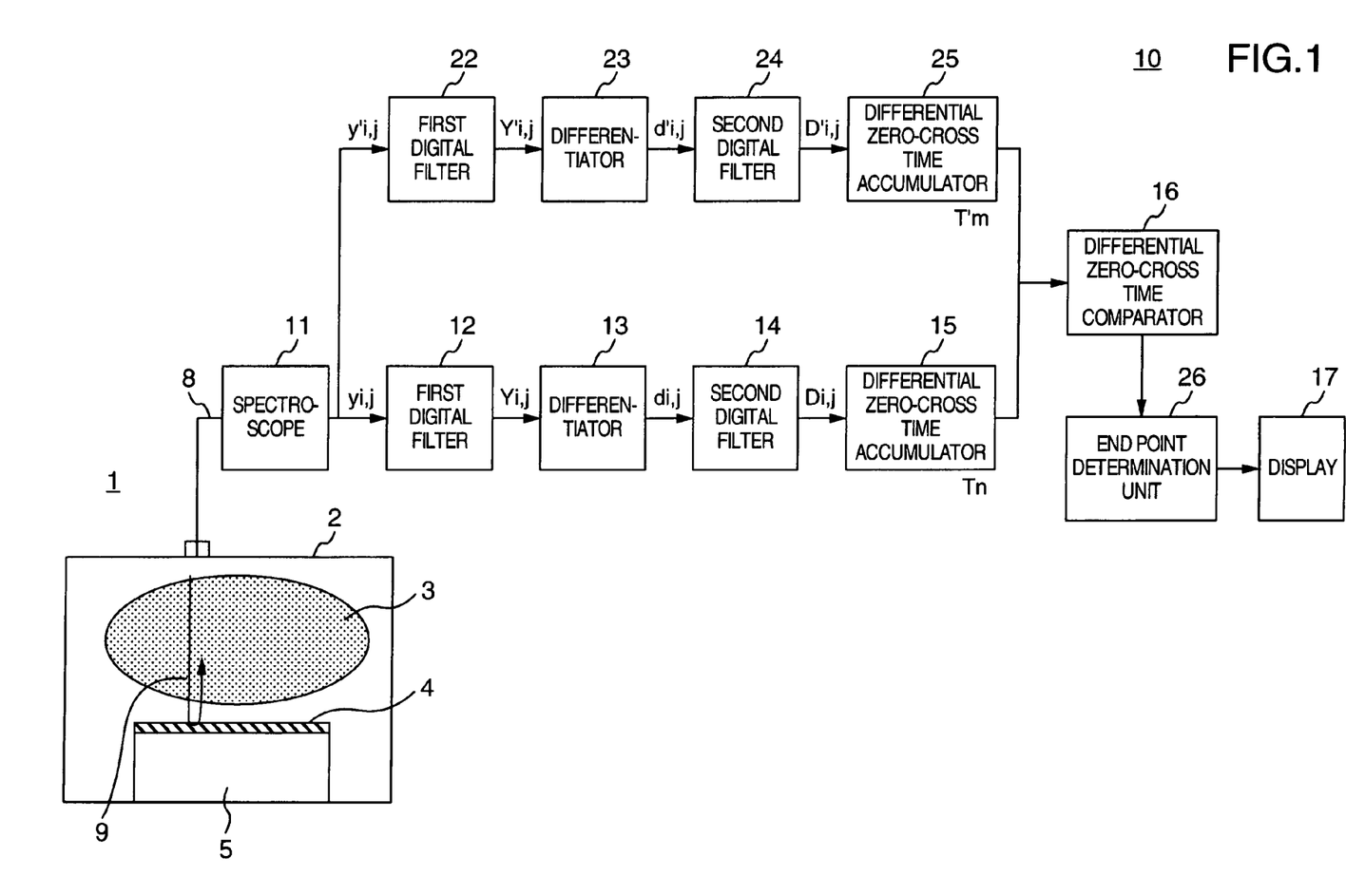
FIG. 1 is a diagram showing the general configuration of a semiconductor wafer etching apparatus with a film thickness measuring apparatus in one embodiment of the present invention.
Figure 2:
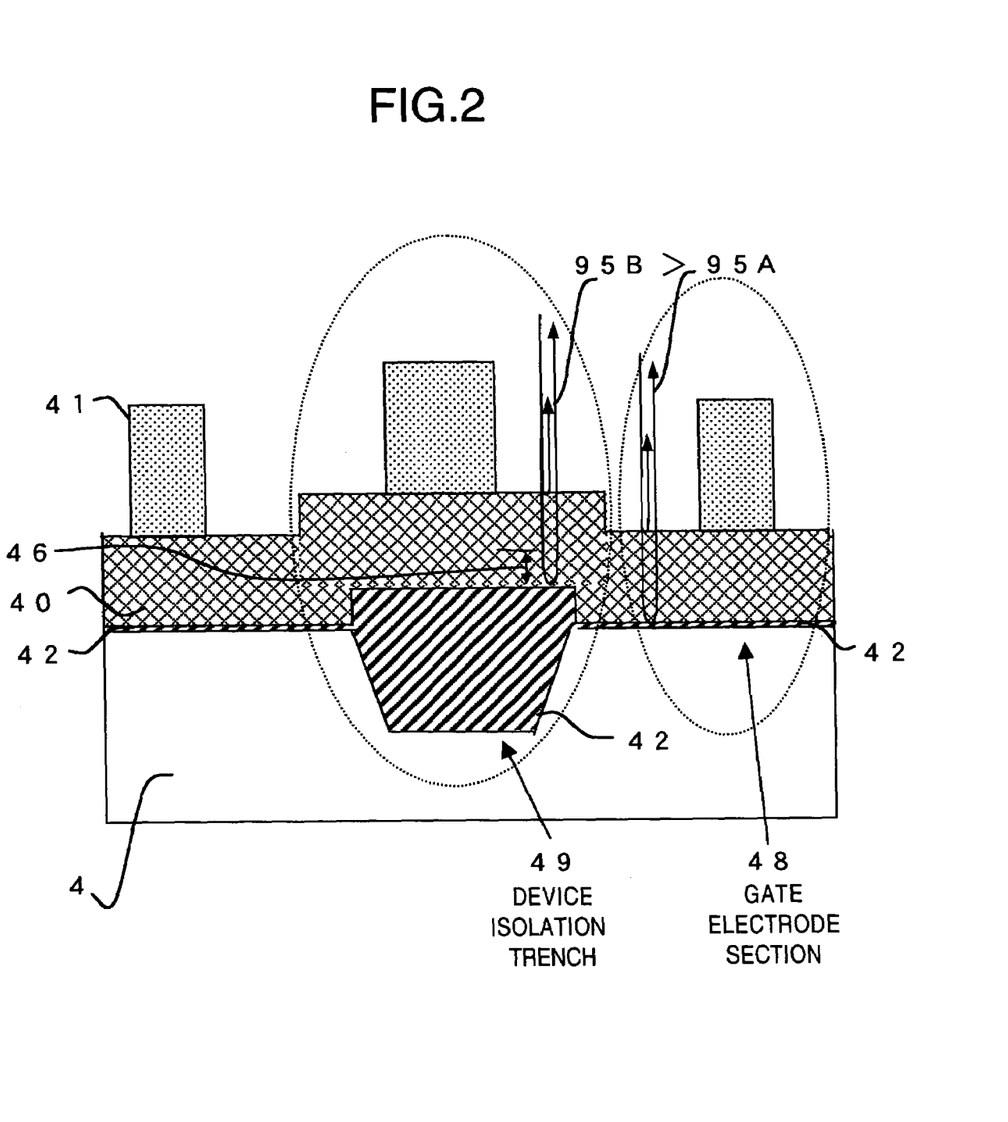
FIG. 2 is a diagram showing an example of the vertical section of a member to be processed 40 for which gate etching is performed.
Figure 3:
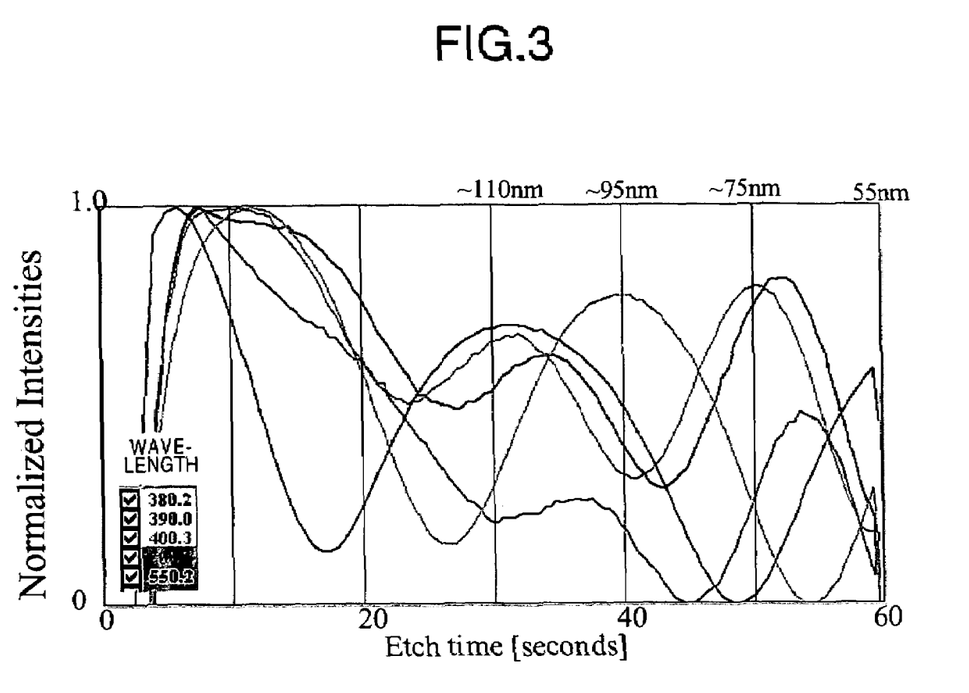
FIG. 3 is a diagram showing an example of a change in an interference light with respect to time for multiple wavelengths during the etching processing is FIG. 2.

A first embodiment of the present invention will be described with reference to FIGS. 1-3. FIG. 1 is a diagram showing, with the use of its vertical section and the blocks, the general configuration of the first embodiment of a semiconductor fabricating apparatus of the present invention. FIG. 2 is a diagram schematically showing the configuration of a wafer to be processed and the overview of light interference in the first embodiment. FIG. 3 is a graph showing an example of data obtained through light interference in the first embodiment.

First, the general configuration of a semiconductor wafer etching apparatus with a film thickness measuring apparatus according to the present invention will be described.

An etching apparatus 1 has a vacuum chamber 2 containing etching gas that is decomposed by microwave power into plasma 3. This plasma 3 is used for etching a member to be processed 4 such as a semiconductor wafer on a wafer table 5. A multiple-wavelength light, emitted from a measuring light source (for example, a halogen light source) of a film thickness measuring apparatus 10, is guided into the vacuum chamber 2 through an optical fiber 8 and is focused onto the member to be processed 4 at a right incident angle. The member to be processed 4 has a poly-silicon layer. The emitted light is formed into an interference light by combining the light refracted on the surface of the poly-silicon layer with the light refracted on the boundary between the poly-silicon layer and the undercoating layer. The interference light is guided through the optical fiber 8 into a spectroscope 11 of the film thickness measuring apparatus 10 for use in measuring the film thickness or in determining the end point based on the state.

The film thickness measuring apparatus 10 comprises a spectroscope 11, a first digital filter circuit 12, a differentiator 13, a second digital filter circuit 14, a differential waveform database (differential zero-cross time accumulator) 15, a differential waveform comparator (differential zero-cross time comparator) 16, a processing state determination unit 26, and a result display 17. FIG. 1 shows the functional configuration of the film thickness measuring apparatus 10. Actually, the film thickness measuring apparatus 10 may comprise a CPU; storage units such as a ROM containing a film thickness measuring processing program and various types of data such as an interference light differential waveform pattern database, a RAM containing measurement data, and an external storage device; data input/output devices; and a communication controller.

When a member to be processed such as a semiconductor wafer is plasma-etched, the semiconductor fabricating apparatus according to the present invention calculates in advance the light interference waveform using the optical physical property values of the member to be processed and selects in advance the wavelength groups whose differential value of the interference light for a predetermined film thickness crosses the zero-value (or takes an extreme value). Data on the positive-to-negative zero-cross (or maximum value) wavelength group $\lambda 1$ and the negative-to-positive zero-cross (or minimum value) wavelength group $\lambda 2$ is stored or recorded in a storage unit or a recording unit provided in, or configured for communication with, the semiconductor fabricating apparatus main body. When the member to be processed 4 is actually processed, the intensity of the interference light of waveform groups $\lambda 1$ and $\lambda 2$ is measured to detect the time at which the differential value of each wavelength group for the measured interference light intensity crosses the zero-value (takes an extreme value). Then, the zero-cross time is compared with a predetermined value to find the film thickness of the member to be processed.

The light emission intensity of an interference light with a wavelength included in the wavelength group $\lambda 1$, obtained by the spectroscope 11, becomes a current detection signal corresponding to the light emission intensity. This signal is then converted to a voltage signal. A plurality of specific-wavelength signals output by the spectroscope 11 as sampling signals are stored in a storage unit, such as a RAM, as time series data yij. This time series data yij is then smoothed by the first digital filter circuit 12 and is stored in a storage unit, such as a RAM, as smoothed time series data Yij. Based on this smoothed time series data Yij, the differentiator 13 calculates time series data dij of a differential coefficient value (first differential value or second differential value), which is then stored in a storage unit such as a RAM. The time series data dij of the differential coefficient value is smoothed by the second digital filter circuit 14 and is stored in a storage unit, such as a RAM, as smoothed differential coefficient time series data Dij. A real pattern of the differential values of each wavelength of the interference light intensity is obtained from this smoothed differential coefficient time series data Dij.

On the other hand, the light emission intensity of an interference light with a wavelength included in the wavelength group $\lambda 2$, obtained by the spectroscope 11, becomes a current detection signal corresponding to the light emission intensity. This signal is then converted to a voltage signal. A plurality of specific-wavelength signals output by the spectroscope 11 as the sampling signals are stored in a storage unit, such as a RAM, as time series data y'ij. This time series data y'ij is then smoothed by a first digital filter circuit 22 and is stored in a storage unit, such as a RAM, as smoothed time series data Y'ij. Based on this smoothed time series data Y'ij, a differentiator 23 calculates time series data d'ij of a differential coefficient value (first differential value or second differential value), which is then stored in a storage unit such as a RAM. The time series data d'ij of the differential coefficient value is smoothed by a second digital filter circuit 24 and is stored in a storage unit, such as a RAM, as smoothed differential coefficient time series data D'ij. A real pattern of the differential values of each wavelength of the interference light intensity is obtained from this smoothed differential coefficient time series data D'ij.

Differential data storage units 15 and 25 store the interference light intensity data on the wavelengths, which vary with the film thickness, or the values of waveforms of the differential data and their times. In particular, the maximum values and minimum values, corresponding to the peaks and troughs of differential data, and their times Tm and T'n are stored. The length of the time between Tm and T'n is compared with a predetermined value pre-set or stored/recorded in the comparison operation unit 16. If the length of the time between Tm and T'n is smaller than the predetermined value, it is determined that the remaining film thickness has reached or almost reached a predetermined size and the remaining film thickness of the member to be processed is determined. The result is displayed on the result display 17.

The inventor and the colleagues have found the following. When a film formed on a semiconductor wafer is etched, a group of a plurality of wavelengths, where one of differential waveform data is the maximum value and the other is the minimum value, may be selected in the neighborhood of the time at which a specific film thickness is attained. The length of the time between the time when a waveform with a wavelength belonging to the groups becomes the maximum or the minimum gets shorter as the film thickness becomes smaller. This means that, for a specific film thickness, the interval between the time when one of the waveforms becomes the maximum and the time when the other becomes the minimum before or after the maximum time is fixed. With this interval pre-set as the base, whether or not the specific film thickness is attained may be determined.

The differential data storage unit 15 stores the change in the differential waveform data of the interference light from the wafer 4 that is the member to be processed as well as the times at which the value of differential waveform data becomes the extreme value (maximum, minimum). That is, data on the times of the peak and the trough of the interference light intensity that varies with the film thickness is stored. In addition, for a specific range of wavelengths at etching processing time, the differential data value of interference light data at a predetermined time during processing is sent from this differential data storage unit 15 to the display 17 and is displayed on the display 17. The data on the times at which the differential value of the interference light with multiple wavelengths becomes the maximum and the minimum may also be displayed on the display 17.

The differential waveform comparator 16 compares the time Tm and the time T'n to obtain the film thickness of the member to be processed. The result is displayed by the result display 17.

Although only one spectroscope 11 is shown in this embodiment, a plurality of spectroscopes 11 may be used to measure and control a wide range of the area of a member to be processed.

FIG. 2 shows an example of the vertical section of the member to be processed 4, such as a semiconductor wafer, to be used in gate etching processing. Referring to FIG. 2, a material to be processed (poly-silicon) 40, which is the film to be processed, is formed on an oxide film 42 that is the undercoating material provided on the wafer (substrate) 4. In addition, a masking material 41 is laminated on the material to be processed 40. For example, when etching a gate film, the undercoating material of the material to be processed 40 is an $SiO_2$ insulation film, and a poly-silicon gate layer is formed on a poly-crystal undercoating material corresponding to the source and the drain. To ensure the independent operation of a gate electrode section 48 of each device, a device separation trench 49 is formed by an oxide film. In this embodiment, the gate electrode section 48 is provided in the side in which a Shallow Trench Isolation (STI) 42 is provided below a mask 71.

A multiple-wavelength light emitted from the spectroscope 11 or the plasma 3 is focused, at an almost right incident angle, on the member to be processed 4 including the laminated structure of the material to be processed 40 and the oxide film 42 that is the undercoating material. The emitted light guided into the gate electrode section 48 where the undercoating material 42 is thin is formed into an interference light 95A composed of the light reflected on the surface of the material to be etched 40 and the light reflected on the boundary between the material to be processed 40 and the undercoating material 42. Similarly, the emitted light guided into the device separation trench 49 where the undercoating material 42 is thick is formed into an interference light 95B composed of the light reflected on the surface of the material to be processed 40 and the light reflected on the boundary between the material to be processed 40 and the undercoating material 42. The interference intensity of these interference lights is reduced as the undercoating oxide film becomes thinner. Therefore, the interference lights 95A and 95B are in the relation 95B>95A.

The reflected light is guided into the spectroscope 11 to generate a signal whose intensity varies according to the thickness of the layer of the material to be etched 40 that is being etched. Among the interference lights detected by the spectroscope 11, the interference light 95B from the thicker processing film part is dominant over the interference light 95A. In this embodiment, the etching state, such as the film thickness and the etching trench depth detected by the interference light, may be obtained more accurately from the interference light reflected on the material above the device separation trench 42 (for example, film thickness 46).

The display 17 is a liquid crystal display or a CRT display, a notification unit that notifies that a predetermined film thickness or an end point is reached with the use of light or sound, or a combination of them. In this embodiment, the display 17 having a display capable of displaying the measurement data as a graph and a unit notifying the state with the use of light and sound is provided.

In addition, the apparatus in this embodiment has a function that, with the use of measurement data displayed on the display 17, displays specific information desired by the user who views the displayed data or allows the user to specify information necessary to detect specific information or to perform calculation. Included in this function are the specification function, such as a pointer allowing the user to specify a specific or any point on the time-wavelength coordinate displayed on the display 17 or the data at that point; the function used to detect data values at a specified point or to calculate specific amounts, such as the time between specific times or a wavelength and amounts indicating the etching state such as an etching speed and a film thickness; and the function to display those amounts in an easy-to-identify position.

The unit calculating the amounts described above may be a calculator in the apparatus or a separate calculator located remotely from the apparatus and capable of sending and receiving measured or detected data via the communication unit.

FIG. 1 shows the functional configuration of the apparatus for measuring an etching amount. Actually, the measuring apparatus 10, except the display 17 and the spectroscope 11, may comprise a CPU; storage units such as a ROM containing an etching depth and film thickness measuring processing program and various types of data such as an interference light differential waveform pattern database, a RAM containing measurement data, and an external storage device; data input/output devices; and a communication controller. This applies also to the other embodiment described below.

FIG. 3 is a graph showing a change in multiple wavelengths with respect to time for data generated by differentiating interference light data detected by the semiconductor fabricating apparatus in this embodiment. As shown in this figure, from several waveforms each with a wavelength, a pair of waveforms may be selected wherein, in the neighborhood of the time at which one of the waveform reaches the extreme value (maximum), the other reaches the minimum. The inventor and the colleagues have found that the difference between the time at which a waveform with one wavelength reaches the maximum and the time at which the other waveform reaches the minimum is reduced as the processing progresses (as the remaining film thickness is reduced), that there is a correlation between the time difference and the film thickness, and that the remaining film thickness (etching (trench) depth) and the end point may be determined by checking this time difference. The present invention is based on this fact.

Figure 4:
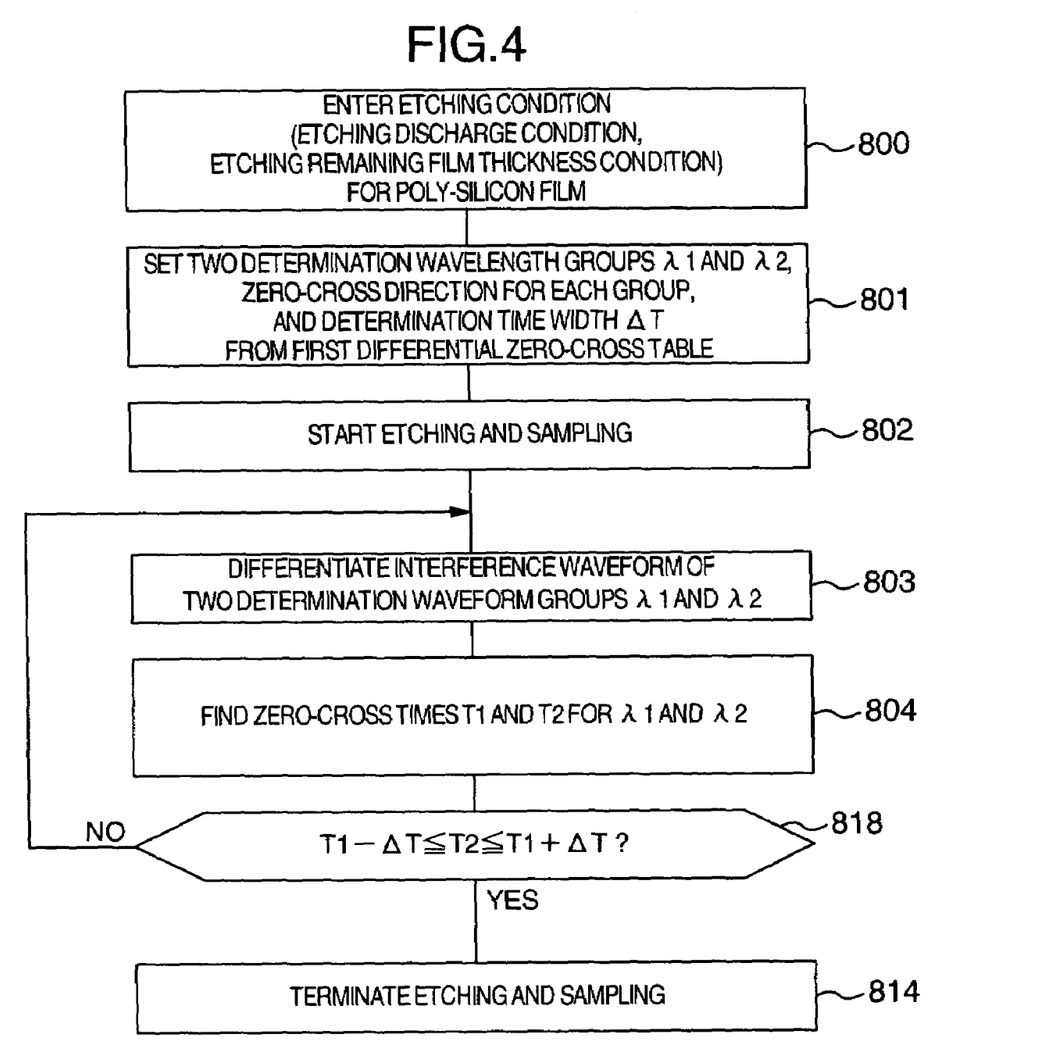
FIG. 4 is a flowchart showing a procedure for finding the film thickness of a member to be processed when etching processing is performed by the film thickness measuring apparatus in FIG. 1.

FIG. 4 shows the operation flow of the semiconductor fabricating apparatus shown in FIG. 1. In particular, the figure shows the flow of operation in which the etching state of a material to be processed is detected for use in adjusting etching processing.

In this embodiment, the semiconductor fabricating apparatus receives in step 800 the etching processing condition for the poly-silicon film that is the material to be processed 40. In this step, the semiconductor fabricating apparatus may receive data from the processing condition database stored or recorded in a storage unit or a recording unit in advance or may receive data entered by the user via an input device such as a keyboard or a mouse provided on the display 17. The semiconductor fabricating apparatus may also read film configuration data from the cassette of the semiconductor wafer 4 or from the wafer 4 itself and detect the data with an operation unit not shown.

Next, in step 801, the wavelength groups λ1 and λ2 for determining the etching state are detected by using data recorded on the differential data storage unit or by comparing the wavelengths with the differential data on intensities stored/recorded on a separate storage/recording unit. In addition, the base time difference ΔT is set for the time difference between the times corresponding to the opposed extreme values described above.

In steps 802, 803, and 804, the waveform data on the interference light obtained by processing the actual wafer 4 is detected, the interference waveforms of determination wavelength groups λ1 and λ2 that are set in step 801 are differentiated, and the times T1 and T2 at which the differential data becomes the extreme value in each wavelength group are calculated.

In step 818, the comparator 16 is used as described above to compare the time difference between T1 and T2 calculated in step 804 (T1−T2 or T2−T1) with the base time difference AT that is set in step 801. If T1−ΔT≦T2≦T1+ΔT is not satisfied, that is, if it is found the time difference ΔT is smaller than the time difference between T1 and T2, the apparatus determines that the desired film thickness is not reached and passes control back to step 803 to continue processing on the material to be processed 40. On the other hand, if T1−ΔT≦T2≦T1+ΔT is satisfied, that is, if it is found that ΔT is equal to or larger than the time difference between T1 and T2, the apparatus determines that the desired film thickness has been reached or exceeded and passes control to step 814 to end etching and sampling.

In this embodiment, etching stops at this point. The sampling of interference lights belonging to the wavelength groups 1 and 2, which is performed via the spectroscope 11, also stops.

The inventor and the colleagues have conducted a theoretical interference analysis of the material to be processed (poly-silicon film) 40 considering the effect of the undercoating material (oxide film) 42 to find that the interference waveform appearing when the film thickness changes as a result of the etching of the material to be processed 40 depends on the thickness of the undercoating film (oxide film) 42.

FIGS. 5A-5D are diagrams showing the undercoating oxide film dependence of the poly-silicon film thickness, where the differential value of the measurement wavelength 400 nm and the measurement wavelength 380 nm zero-crosses from negative to positive when etching processing is executed by the film thickness measuring apparatus shown in FIG. 1 and, with that film thickness, the undercoating oxide film dependence of the wavelength where the differential value zero-crosses from positive to negative.

Figure 5A:
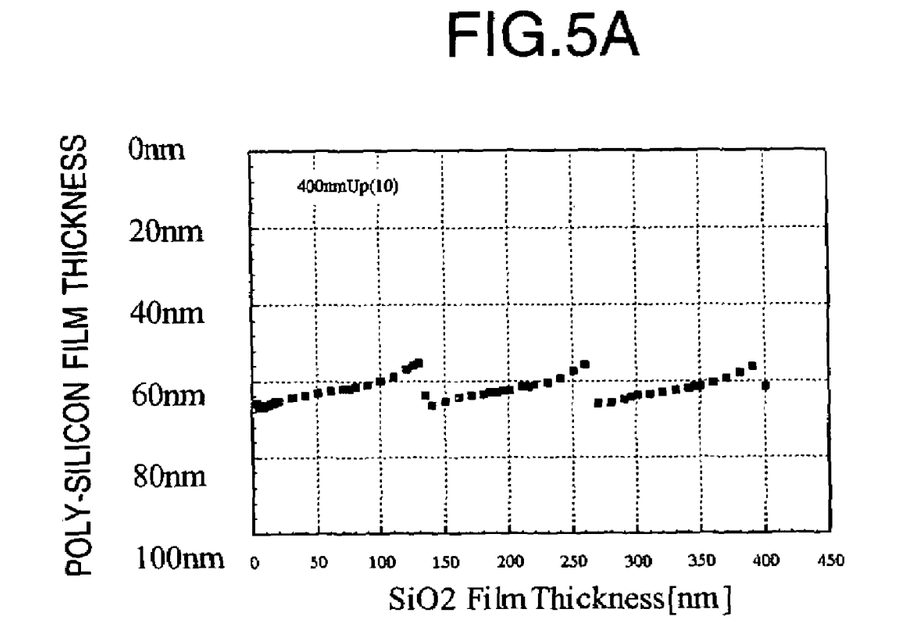
FIGS. 5A-5D are diagrams showing the undercoating oxide film dependence of a poly-silicon film thickness and the undercoating oxide film dependence of a wavelength when etching processing is performed by the film thickness measuring apparatus in FIG. 1.

For a poly-silicon film about 60 nm thick, FIG. 5A shows the poly-silicon film thickness with respect to the undercoating oxide film thickness for a light with the wavelength of 400 nm that zero-crosses from negative to positive (minimum value is reached). As shown in the figure, the poly-silicon film thickness changes cyclically at about 130 nm increments in the undercoating oxide film thickness. This is because the undercoating oxide film interference occurs immediately after the poly-silicon film interference.

Figure 5B:
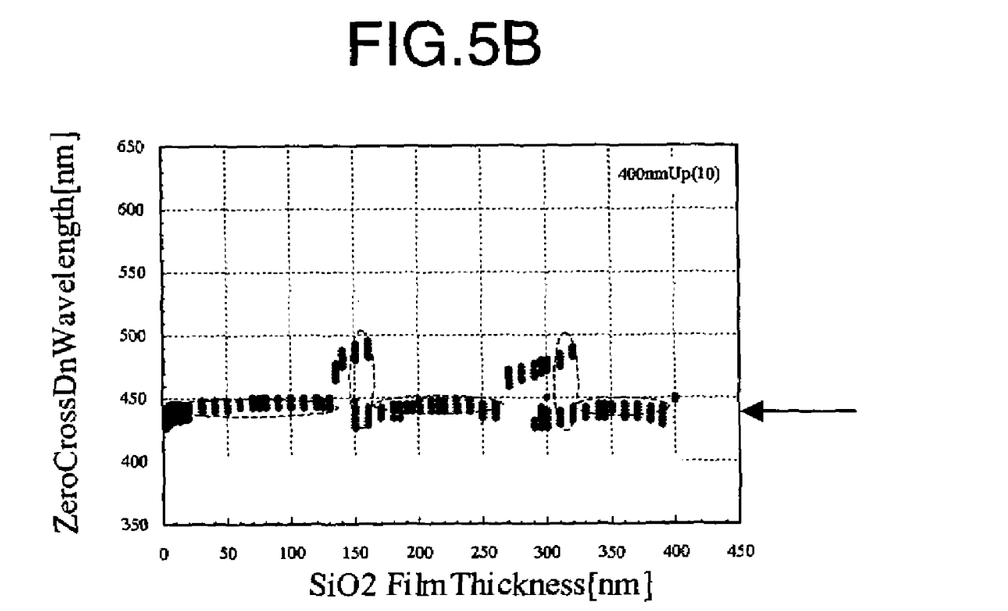
Figure 5C:
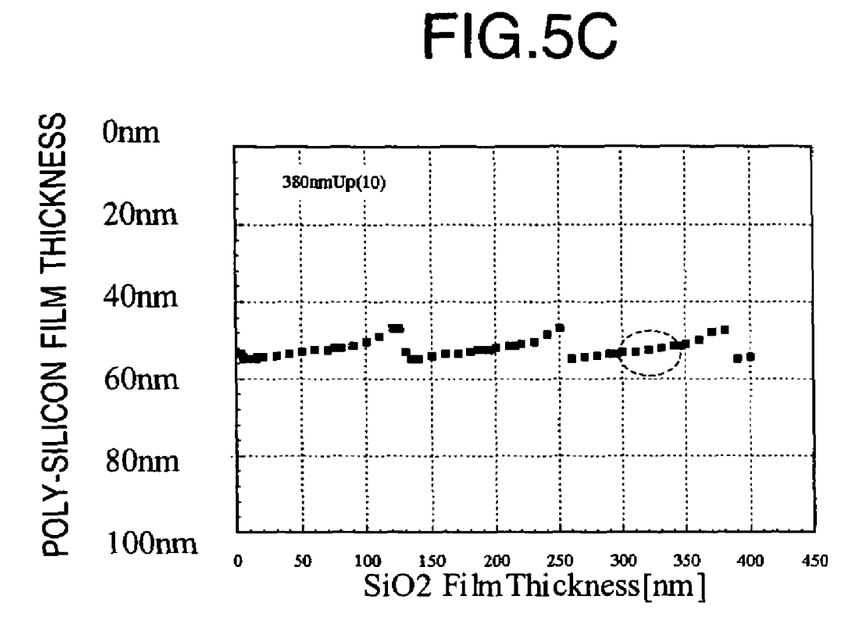
Figure 5D:
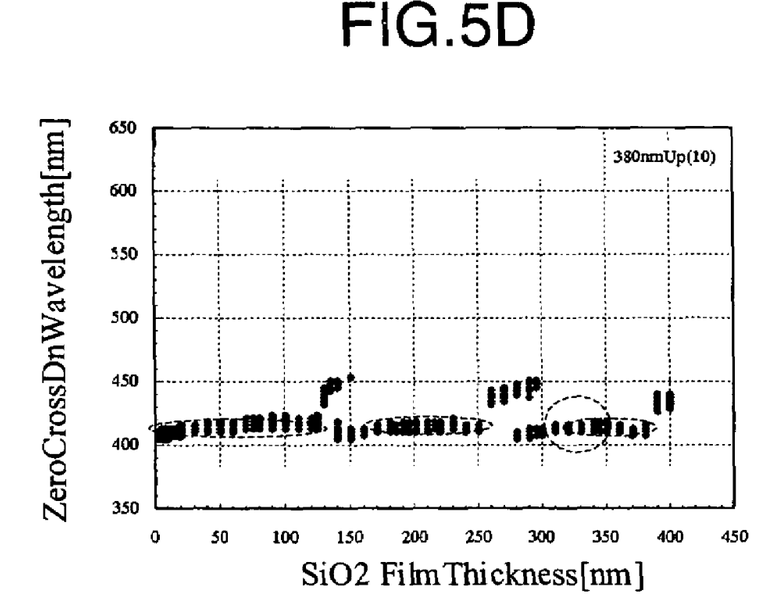

That is, the poly-silicon film thickness changes cyclically every sin (4πnd/λ), where n is the refraction index of the undercoating oxide film, d is the thickness of the undercoating oxide film, and λ is the wavelength. FIG. 5B shows the wavelength group of waveforms that zero-cross from positive to negative (maximum value is reached) when the light with the wavelength of 400 nm zero-crosses from negative to positive for the poly-silicon film thickness. As shown in the figure, the wavelength group ranges from about 430 to 500 nm. Therefore, the approximate thickness of the undercoating oxide film may be obtained by measuring the light with the wavelength of 400 nm and the wavelength group of about 430 nm to 500 nm.

For example, when the extreme value of the wavelength of 400 nm matches the extreme value of the wavelength of 440 nm, the thickness of the undercoating oxide film is several nm to 130 nm, about 170 nm to 260 nm, or about 330 nm to 380 nm.

When the zero-cross of the wavelength of 400 nm, the wavelength of 440 nm, and 480 nm match, the undercoating oxide film thickness is found to be about 140 nm to 170 nm and about 300 nm to 330 nm. With the wafer product specifications taken into consideration, the undercoating oxide film thickness is further limited. When the measurement wavelength of 380 nm shown in FIG. 5C zero-crosses from negative to positive using the undercoating oxide film thickness (about 300 nm to 320 nm) obtained as described above, the wavelength group λ2 that zero-crosses from positive to negative is narrowed to about 410 nm to 420 nm (about 410 nm to 450 nm) (see FIG. 5D). At the same time, the accuracy of the poly-silicon film thickness is increased from about 48 nm-56 nm to about 52 nm-55 nm.

A plurality of spectroscopes may be used to measure and control a wide range of the area of a member to be processed.

Without using a light source that supplies a light to the vacuum chamber 2 as in the above embodiment, an interference light may also be measured by a measuring instrument via the spectroscope 11 using a light from the plasma 3 generated in the vacuum chamber 2. In this case, the plasma light reflected on the surface of the wafer 4 is supplied to the spectroscope 11. In addition, to measure a change in the plasma light, a measurement port and an optical transmission unit are provided on the side wall of the vacuum chamber 2 such that the light inside the chamber may be received. The signal detected by them is used as a reference light. This reference light must be a light that does not pass through the light path into which the light from the wafer surface directly enters and that can detect a change in the plasma light. In this embodiment, the plasma light is received by the light receiver provided on the side wall.

Next, a second embodiment of the present invention will be described with reference to FIGS. 6, 7A, 7B, and 8.

Figure 6:
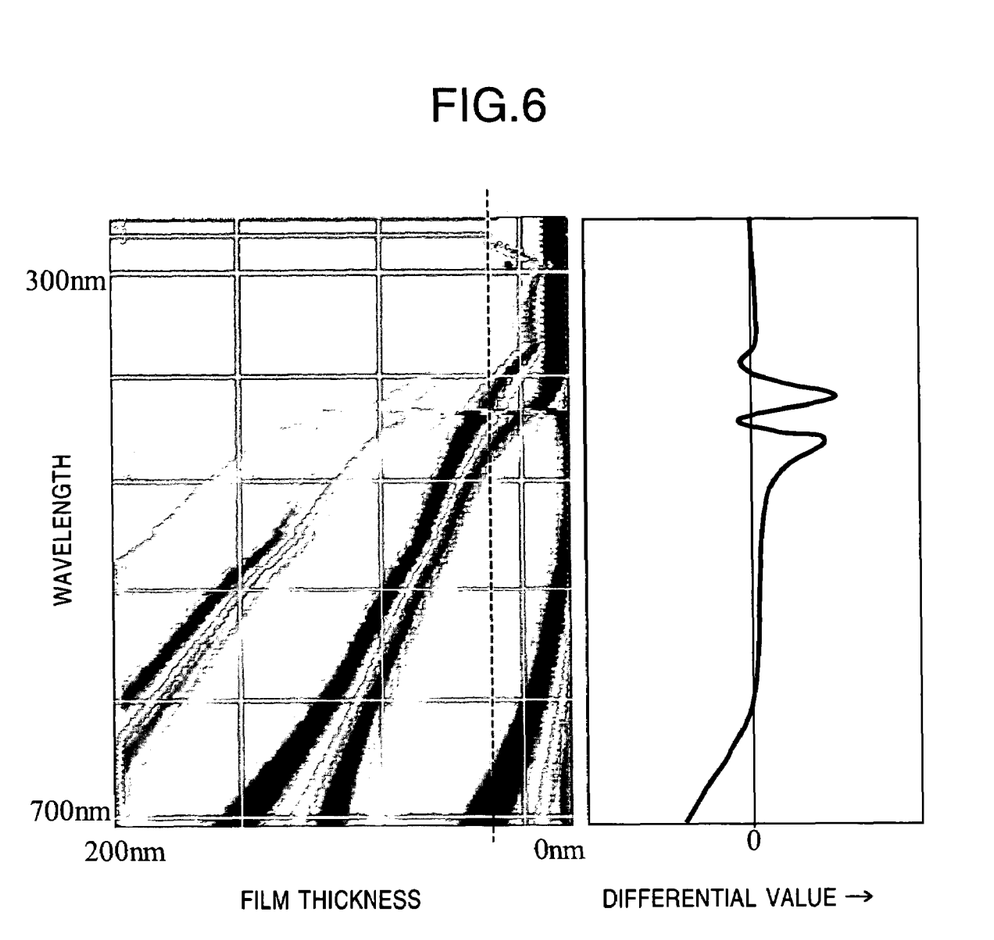
FIG. 6 is a diagram showing a multiple-wavelength differential interference pattern and the wavelength dependence of a differential value in a poly-silicon film thickness in another embodiment of the present invention.
Figure 7A:
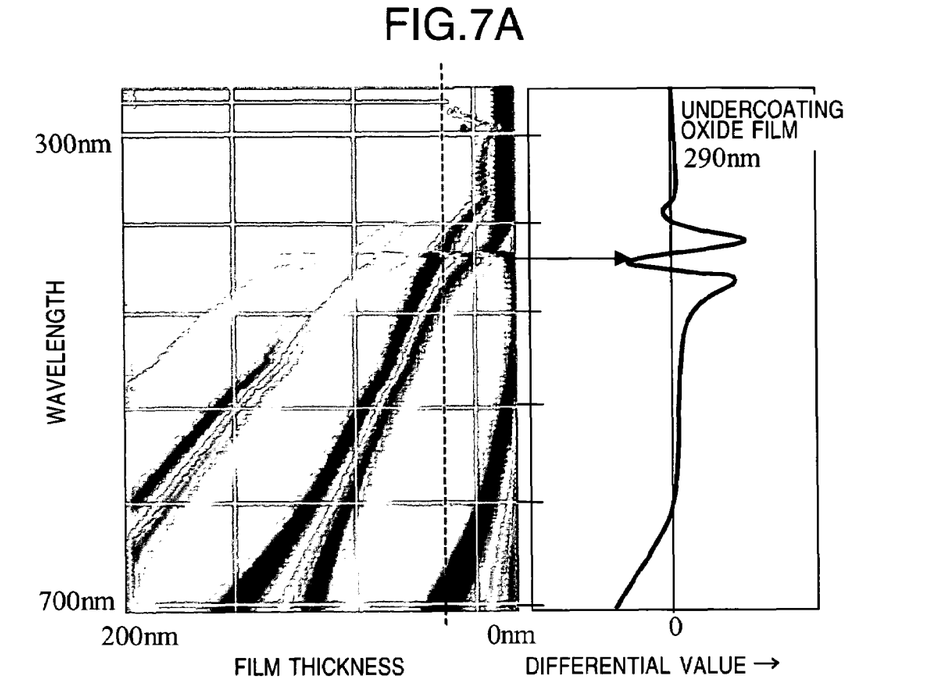
FIGS. 7A and 7B are diagrams showing a multiple-wavelength differential interference pattern and the wavelength dependence of a differential value in a poly-silicon film thickness in the other embodiment of the present invention.
Figure 7B:
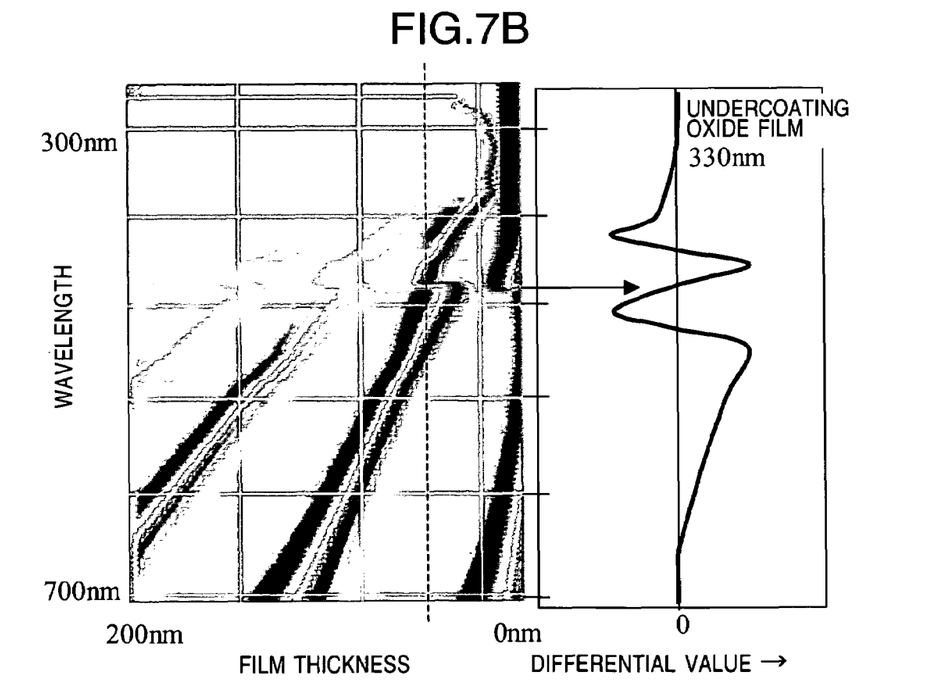

FIGS. 6, 7A, and 7B are diagrams showing interference waveforms detected by a semiconductor fabricating apparatus in the second embodiment of the present invention.

The left-hand side graph in FIG. 6 shows a change in the interference light intensity with the wavelength on the vertical axis and the film thickness (processing time) on the horizontal axis. The right-hand side graph shows a change in the intensity in the wavelength area ranging from 300 nm or shorter to 700 nm or longer at a specific time indicated by the dotted line in the left-hand side graph.

This figure shows that the interference light greatly changes around a specific wavelength and that the differential data on the intensity fluctuates widely. As with FIG. 6, FIGS. 7A and 7B show a change in the interference light intensity with the wavelength on the vertical axis and the film thickness (processing time) on the horizontal axis. FIG. 7A shows the change when the thickness of an oxide film 42 formed below the poly-silicon film that is a material to be processed 40 is 290 nm, while FIG. 7B shows the change when the thickness of the undercoating oxide film is 330 nm. The inventor and the colleagues have found that, as shown in the figures, the wavelength value at which the intensity of the interference light differential data fluctuates widely depends on the thickness of the undercoating oxide film 42, that is, there is a correlation between the wavelength and the thickness of the undercoating oxide film 42 and, therefore, the thickness of the undercoating oxide film may be detected using interference light data obtained when the film, which is above the oxide film and which is to be processed, is etched. This embodiment of the present invention is based on this fact.

Figure 8:
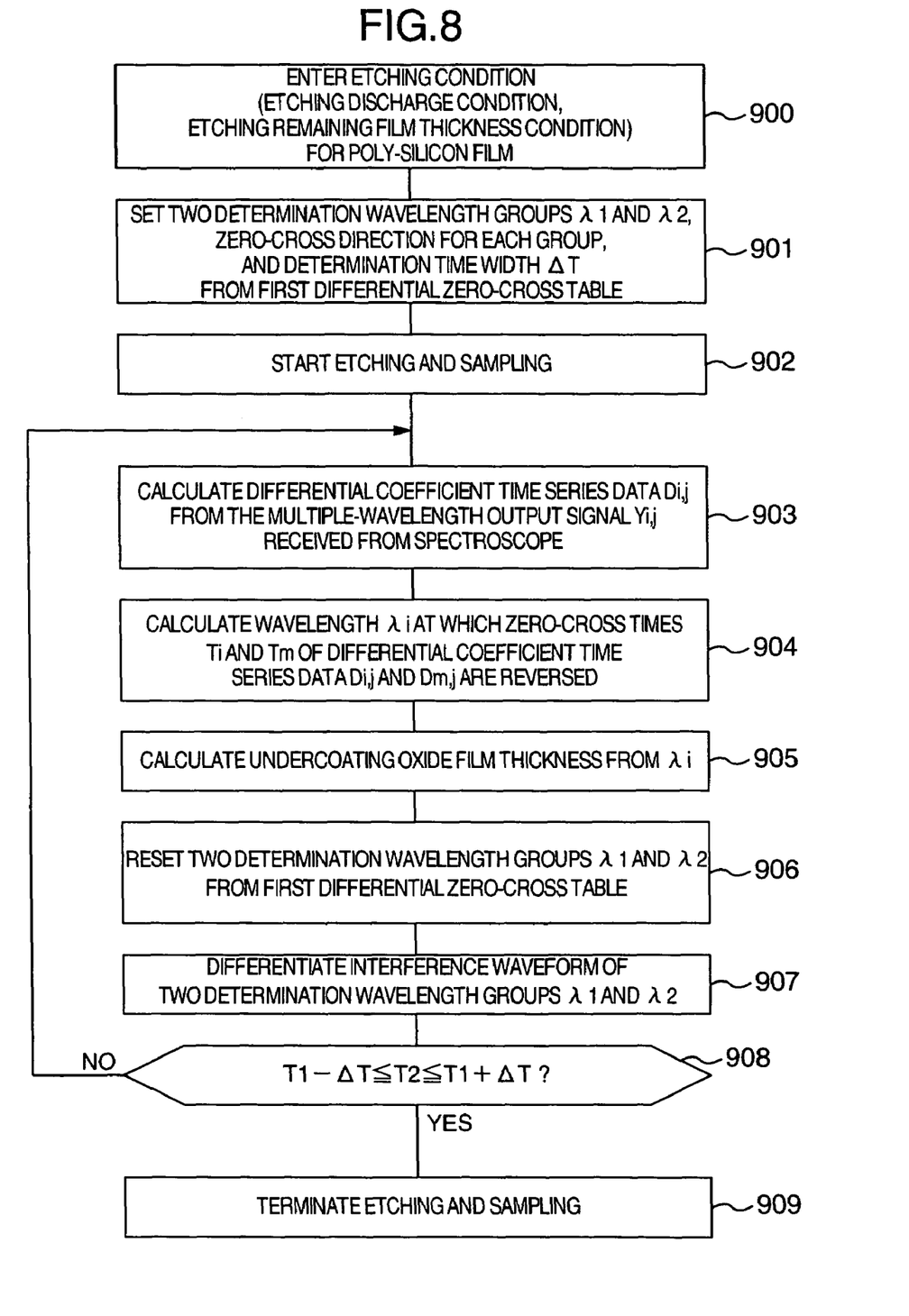
FIG. 8 is a flowchart showing the operation of the other embodiment of the present invention.

FIG. 8 is a flowchart showing the flow of the operation of a semiconductor fabricating apparatus in the embodiment based on the interference waveforms shown in FIGS. 6, 7A, and 7B. In this embodiment, the intensity of an interference light with the wavelength ranging from about 300 nm to 700 nm is obtained during poly-silicon gate etching and its differential data is calculated. Instead of a zero-crossing (extreme value is reached) wavelength is shifted sequentially to the short wave side as the film thickness of the poly-silicon film to be processed 40 is decreased, the wavelength in the short wave side is reversed before the wavelength in the long wave side because of the undercoating oxide film thickness. This characteristic is used to calculate the undercoating oxide film thickness from the reversed wavelength.

This enables the thickness of the undercoating film (undercoating oxide film), which has been determined by measuring a sample wafer, to be detected using the interference light data obtained when the film above the undercoating film is processed. This minimizes a throughput decrease or a fabrication cost increase that has been caused by the measurement of a sample.

Using the undercoating oxide film thickness calculated as described above can also increase the accuracy in the thickness measurement of a poly-silicon film that is the material to be processed.

In FIG. 8, the etching condition (etching discharge condition, etching remaining film thickness condition) for the material to be processed (poly-silicon film) is entered (step 900). Based on the etching remaining film thickness condition, the two determination wavelength groups $\lambda 1$ and $\lambda 2$, their zero-cross directions, and the determination time width $\Delta T$ are set from data stored in the data storage unit (step 901).

Next, the etching and sampling of the wafer 4 is started (step 902), the differential coefficient time series data $D_{i,j}$ is calculated from the multiple-wavelength output signal $y_{i,j}$ received from the spectroscope (step 903), and the wavelength $\lambda 1$ at which the zero-cross times $T_i$ and $T_m$ of the differential coefficient time series data $D_{i,j}$ and $D_{m,j}$ are reversed is calculated (904), where i is the measured wavelength in the long wavelength side and m is the measured wavelength in the short wavelength side.

The times $T_i$ and $T_m$ satisfy the relation $T_i<T_m$ in the wavelength area where there is no effect of the undercoating oxide film, while the times $T_i$ and $T_m$ satisfy the relation $T_i>T_m$ in the wavelength area where there is the effect of the undercoating oxide film. From the undercoating oxide film thickness and the distortion wavelength value which have this wavelength $\lambda i$ in the database in advance, the undercoating oxide film thickness is calculated (step 905). Then, using the calculated undercoating oxide film thickness, the two determination wavelength groups $\lambda 1$ and $\lambda 2$ are reset from the differential zero-cross table (step 906).

The interference waveform of the two determination wavelength groups $\lambda 1$ and $\lambda 2$ that have been reset is differentiated (step 907). Next, the time difference $\Delta T$ that is the base value set in step 901 is compared with the time difference between the zero-cross times $T1$ and $T2$, that is, a check is made if the relation $T1-\Delta T \leq T2 \leq T1+\Delta T$ is satisfied (step 908) to determine if etching and sampling should be ended (step 909). If the comparison between the time difference $\Delta T$ and the time difference between the zero-cross times $T1$ and $T2$ (check if the relation $T1-\Delta T \leq T2 \leq T1+\Delta T$ is satisfied: step 908) results in "NO", the operation is repeated beginning in step 903. If the undercoating oxide film thickness is calculated, steps 903 to 905 need not necessarily be executed. On the other hand, if the comparison results in "YES" in step 908, control is passed to step 909 to end etching and sampling.

In contrast to the prior art in which the processing throughput and the cost are high because a sample wafer must be measured, the apparatus according to the present invention allows data, obtained during the processing of an upper-layer film, to be used to detect the film thickness of a lower-layer film, thus increasing the processing throughput of the whole apparatus and reducing the cost.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor fabricating method for etching a semiconductor wafer, comprising the steps of:
placing the semiconductor wafer having a film thereon inside of a chamber;
generating plasma inside of the chamber;
detecting a quantity of interference lights for each of at least two wavelengths obtained from a surface of the wafer for a predetermined time period during the etching of the wafer;
detecting a first time point at which the detected quantity of the interference lights for one of the two wavelengths becomes a maximum and a second time point at which the detected quantity of the interference lights for the other wavelength becomes a minimum;
determining a state of the etching based on a result of comparing a predetermined value with an interval between the first time point and the second time point, wherein both the first and second time points are detected by using outputs of a detector for detecting a quantity of the interference lights; and
controlling the etching in accordance with a result of the determining.

2. The semiconductor fabricating method according to claim 1, further comprising the steps of:
determining a thickness of the film being etched when the interval is determined to be smaller than the predetermined value; and
wherein said controlling the etching step is performed in accordance with the results of both determining steps.

3. The semiconductor fabricating method according to claim 1, further comprising the step of:
stopping the etching processing when the interval is determined to be smaller than the predetermined value.

4. The semiconductor fabricating method according to claim 2, further comprising the step of:
stopping the etching processing when the interval is determined to be smaller than the predetermined value.

* * * * *